United States Patent
Son

[11] Patent Number: 5,578,511
[45] Date of Patent: Nov. 26, 1996

[54] METHOD OF MAKING SIGNAL CHARGE TRANSFER DEVICES

[75] Inventor: Dong K. Son, Kwacheon-si, Rep. of Korea

[73] Assignee: LG Semicon Co., Ltd., Seoul, Rep. of Korea

[21] Appl. No.: 569,317

[22] Filed: Dec. 8, 1995

Related U.S. Application Data

[60] Continuation of Ser. No. 218,411, Mar. 25, 1994, abandoned, which is a division of Ser. No. 995,981, Dec. 23, 1992, abandoned.

[30] Foreign Application Priority Data

Dec. 23, 1991 [KR] Rep. of Korea ............. 23862/1991

[51] Int. Cl.$^6$ ............. H01L 21/265; H01L 21/70; H01L 27/00
[52] U.S. Cl. ............. 437/35; 437/50; 437/53; 257/221; 257/248
[58] Field of Search ............. 437/35, 50, 53; 257/221, 248

[56] References Cited

U.S. PATENT DOCUMENTS

| | | |
|---|---|---|
| 3,906,542 | 9/1975 | Krambeck et al. ............. 257/248 |
| 3,908,262 | 9/1975 | Stein ............. 437/35 |
| 3,914,857 | 10/1975 | Goser et al. ............. 437/35 |
| 3,936,861 | 2/1976 | Borel et al. ............. 257/248 |
| 3,967,365 | 7/1976 | Friedrich ............. 437/53 |
| 4,943,728 | 7/1990 | Dykstra et al. . |
| 4,979,001 | 12/1990 | Alter ............. 357/13 |
| 4,994,875 | 2/1991 | Hynecek ............. 257/216 |
| 5,227,650 | 7/1993 | Noguchi et al. . |
| 5,289,022 | 2/1994 | Iizuka et al. ............. 257/248 |
| 5,315,137 | 5/1994 | Asaumi et al. ............. 257/248 |

FOREIGN PATENT DOCUMENTS

| | | | |
|---|---|---|---|
| 0192142A | 8/1986 | European Pat. Off. ............. | 257/221 |
| 55-82631 | 1/1982 | Japan . | |
| 59-77708 | 1/1985 | Japan . | |
| 62-171507 | 1/1989 | Japan . | |
| 63-115547 | 11/1989 | Japan . | |
| 4-94547 | 3/1992 | Japan ............. | 437/53 |

*Primary Examiner*—Mary Wilczewski
*Assistant Examiner*—Brian K. Dutton
*Attorney, Agent, or Firm*—Morgan, Lewis and Bockius LLP

[57] ABSTRACT

A method of making a signal charge transfer device, including the steps of: forming first conductivity-type channel regions (30) in each of second conductivity-type wells (20) formed in a first conductivity-type semiconductor substrate (10); forming a plurality of first electrodes (50a) uniformly spaced from one another, and then forming an insulation film (40) for insulating the first electrodes from one another; forming a primary potential barrier (70) in each of the channel regions by subjecting the channel regions to a primary-ion implantation process using the plurality of first electrodes as a mask; forming a secondary potential barrier (70a) in each of the channel regions at lower corners of each of the first electrodes by subjecting the channel regions to a sloped secondary-ion implantation process using the plurality of first electrodes as a mask; and forming second electrodes (80a), each being disposed between the adjacent ones of the first electrodes, and then forming an insulation film (60) to insulate the second electrodes from one another. According to one embodiment, the sloped secondary implantation includes repeated implantations of B$^+$ ions only into one side of both sides of each of the plurality of first electrodes at 30°–60° to a horizontal line of the semiconductor substrate. According to another embodiment, the sloped ion implantation includes repeated implantations of As or P ions only into one side of both sides of each of the plurality of first electrodes at 120°–150° to the horizontal substrate line.

10 Claims, 5 Drawing Sheets

5,578,511

METHOD OF MAKING SIGNAL CHARGE TRANSFER DEVICES

This application is a continuation, of application Ser. No. 08/218,411, filed Mar. 25, 1994, now abandoned, which is a divisional of application 07/995,981 filed on Dec. 23, 1992, now abandoned.

BACKGROUND OF THE INVENTION

1. Field of the Invention

The present invention relates in general to an image sensor, and more particularly to signal charge transfer devices of an image sensor and a method of making the same.

2. Description of the Prior Art

An image sensor may generally be classified into a charge coupled device (CCD) image sensor and a contact image sensor. The image sensor receives an optical signal corresponding to an image and converts the received optical signal into an electrical signal. The image sensor then processes the electrical signal to be displayable or printable. A signal charge transfer device is typically provided as an essential component in the CCD image sensor or the contact image sensor, to transfer the electrical signal in a single direction.

Signal charge transfer devices of the CCD image sensor will hereinafter be described as an example of the signal charge transfer device according to the prior art.

The CCD image sensor essentially comprises a semi-conductor substrate such as a silicone, a plurality of optical detectors, vertical signal charge transfer devices and a horizontal signal charge transfer device, all of which are formed on the semi-conductor substrate. A P-N junction photodiode is generally used as the optical detector. Selecting a proper device as the optical detector makes it possible shooting of an object from a visible ray region to an infrared ray region.

Referring to FIG. 1, there is shown a schematic block diagram of a conventional CCD image sensor of an interline transfer type. As shown in this drawing, the conventional CCD image sensor comprises a plurality of uniformly arranged photodiodes 1, vertical signal charge transfer devices 2 arranged between adjacent columns of the photodiodes 1, a horizontal signal charge transfer device 3 arranged perpendicularly to outputs of the vertical signal charge transfer devices 2, and a sensing amplifier 4 for sensing signal charges outputted from the horizontal signal charge transfer device 3, amplifying the sensed signal charges by a predetermined amplification degree and outputting the amplified signal charges as voltage information of desired gain.

In FIG. 1, the signal charges are transferred in directions designated by the dotted arrows.

The operation of the conventional CCD image sensor with the above-mentioned construction will be described in brief.

When light is incident on the photodiodes 1 corresponding to pixels of a frame, the image signal charges are produced in the photodiodes 1. The image signal charges from the photodiodes 1 are transferred to the vertical signal charge transfer devices 2 and then to the horizontal signal charge transfer device 3 upon application of predetermined clock signals to electrodes (not shown in FIG. 1) which are formed over the photodiodes 1 and the vertical signal charge transfer devices 2.

The image signal charges transferred to the horizontal signal charge transfer device 3 are then transferred toward the output of the horizontal signal charge transfer device 3 upon application of predetermined clock signals to electrodes (not shown in FIG. 1) which are formed on the horizontal signal charge transfer device 3. In the horizontal signal charge transfer device 3, the image signal charges are transferred through an output gate electrode (not shown in FIG. 1) to a floating diffusion region (not shown in FIG. 1), in which the transferred image signal charges are stored temporarily. Thereafter, the image signal charges stored in the floating diffusion region are sensed by the sensing amplifier 4, which amplifies the sensed image signal charges by a predetermined amplification degree and outputs the amplified image signal charges as voltage information.

Referring to FIG. 2, there is shown a sectional view of the horizontal signal charge transfer device 3 taken on the line a—a' of FIG. 1. As shown in this figure, the horizontal signal charge transfer device 3 comprises a first conductive type or n* type semi-conductor substrate 5, a second conductive type or P type well 6 formed on the n* type substrate 5, a n* type channel region 7 formed on the P type well 6, a n+ type floating diffusion region 8 formed on the P type well 6, being connected to an end portion of the n* type channel region 7, for temporarily storing the image signal charges from the n* type channel region 7, a n* type reset region 9 formed on the P type well 6, being connected to an end portion of the n+ type floating diffusion region 8, a n+ type reset drain region 10 formed on the P type well 6, being connected to an end portion of the n* type reset region 9, for discharging the image signal charges transferred from the n+ type floating diffusion region 8 through the n* type reset region 9, a plurality of uniformly spaced n− type impurity regions 11 formed on the n* type channel region 7, a plurality of first electrodes 12 formed on the n− type impurity regions 11, a plurality of second electrodes 13, each formed between adjacent ones of the first electrodes 12, an output gate electrode 14 formed over the end portion of the n* type channel region 7, for receiving a constant direct current (DC) voltage, and a reset electrode 15 formed over the n* type reset region 9, for receiving a reset clock signal Rφ. The first and second electrodes 12 and 13 alternately arranged constitute a plurality of pairs including odd pairs to which a first clock signal Hφ1 is applied and even pairs to which a second clock signal Hφ2 of the opposite level to that of the first clock signal is applied.

Herein, concentrations of n type impurity ions are represented by n*, n+ and n− and levels thereof can be expressed in the following order:

$$n+ > n^* > n- \qquad (1)$$

Although not shown in FIG. 2, the sensing amplifier 4 in FIG. 1 senses the image signal charges temporarily stored in the n+ type floating diffusion region 8 in the horizontal signal charge transfer device 3 and amplifies the sensed image signal charges by the predetermined amplification degree.

In FIG. 2, the reference numeral 16, not described, is an insulating layer. Also, a polysilicon doped with an impurity may typically be used as materials of the first and second electrodes.

The operation of the horizontal signal charge transfer device 3 with the construction mentioned above with reference to FIG. 2 will hereinafter be described in conjunction with FIGS. 3a to 3c, which are potential diagrams of the horizontal signal charge transfer device 3 which are different according to states of the clock signal s Hϕ1 and Hϕ2 being applied thereto.

Upon no application of the first and second clock signals Hϕ1 and Hϕ2 to the first and second electrodes 12 and 13 under the condition that the image signal charges from the vertical signal charge transfer devices 2 are transferred to the horizontal signal charge transfer device 3, the potential diagram of the horizontal signal charge transfer device 3 is as shown in FIG. 3a.

Upon application of the first clock signal Hϕ1 of high level voltage and the second clock signal Hϕ2 of low level voltage to the first and second electrodes 12 and 13, the potential diagram of the horizontal signal charge transfer device 3 is as shown in FIG. 3b.

Also upon application of the first clock signal Hϕ1 of low level voltage and the second clock signal Hϕ2 of high level voltage to the first and second electrodes 12 and 13, the potential diagram of the horizontal signal charge transfer device 3 is as shown in FIG. 3c.

Under the condition that the first and second clock signals Hϕ1 and Hϕ2 are applied to the first and second electrodes 12 and 13, with the high and low states being repeated, the image signal charges are transferred toward the output gate electrode 14. At this time, since the constant DC voltage is being biased to the output gate electrode 14 in the horizontal signal charge transfer device 3, a potential is constantly formed in the region under the output gate electrode 14, as shown in FIGS. 3a to 3c, Under this condition, upon application of the first clock signal Hϕ1 of high level voltage and the second clock signal Hϕ2 of low level voltage to the first and second electrodes 12 and 13, the potentials in the regions under the last ones of the first and second electrodes 12 and 13 become high, thereby causing the image signal charges to get beyond the potential barrier in the region under the output gate electrode 14 and then to flow to the floating diffusion region 8. This case is shown in FIG. 3b.

On the contrary, upon application of the first clock signal Hϕ1 of low level voltage and the second clock signal Hϕ2 of high level voltage to the first and second electrodes 12 and 13, the potentials in the regions under the last ones of the first and second electrodes 12 and 13 become low, thereby causing the image signal charges not to get beyond the potential barrier in the region under the output gate electrode 14. As a result, no image signal charge is transferred to the floating diffusion region 8. This case is shown in FIG. 3c.

Herein, the n− type impurity regions 11 may be formed by implanting a second conductive type or P type impurity such as a boron in the corresponding regions of the n* type channel region 7. Namely, implanting the boron ions in the n* type channel region 7 causes the n* type concentration of the implanted regions to be lowered to n− type.

As shown in FIGS. 3a to 3c, the image signal charges are transferred toward the output of the horizontal signal charge transfer device 3 by the stepped potentials which are formed by the n− type impurity regions 11.

The two phase clocking method as shown in FIGS. 2 and 3 may typically be employed as the clocking method of the horizontal signal charge transfer device 3.

Although not shown, a construction of the vertical signal charge transfer device 2 is substantially the same as that of the horizontal signal charge transfer device 3.

Referred to as a signal charge transfer efficiency (CTE) is a degree which the image signal charges are transferred efficiently with no loss in the vertical and horizontal signal charge transfer devices. The image sensor of good quality has higher CTE. The CTE is in inverse proportion to a length 1 of the electrode.

However, the conventional image sensor has a disadvantage, in that, when the number of pixels and a size of an optical system are determined, a length L of a horizontal unit cell is determined and the length l of the electrode cannot be lowered below L/4. This results in a limitation in increase of the CTE.

SUMMARY OF THE INVENTION

Therefore, the present invention has been made in view of the above problem, and it is an object of the present invention to provide signal charge transfer devices of an image sensor and a method of making the same, in which a CTE can be increased without reduction in a length of an electrode.

In accordance with one aspect of the present invention, there is provided a signal charge transfer device comprising: a channel region of a first conductive type; a plurality of uniformly spaced first electrodes formed on said first conductive type channel; a plurality of second electrodes, each being formed between adjacent ones of said first electrodes; an insulating layer for electrically isolating said channel region and said first and second electrodes from one another; and a plurality of multi-stepped impurity regions of the first conductive type, each being formed in a portion of said channel region under each of said second electrodes and having a concentration lower than that of said channel region.

In accordance with another aspect of the present invention, there is provided a method of making a signal charge transfer device, comprising the steps of: preparing a semiconductor layer of a first conductive type as a channel region; sequentially forming a first insulating layer and a first conductive layer on said channel region; patterning said first conductive layer to form a plurality of uniformly spaced first electrodes; implanting an impurity of a second conductive type in portions of said channel region between adjacent ones of said first electrodes vertically thereto, using said first electrodes as a mask, to form impurity regions of the first conductive type of a concentration lower than that of said channel region; forming second insulating layers on the surfaces of said first electrodes; implanting the impurity of the second conductive type in the portions of said channel region between the adjacent ones of said first electrodes slantly at a plurality of angles thereto, using said first electrodes as a mask, to deform the impurity regions of the first conductive type into multi-stepped impurity regions; and forming a second conductive layer on said first and second insulating layers and pattering said second conductive layer to form a plurality of second electrodes, each being disposed between the adjacent ones of said first electrodes.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 4A:
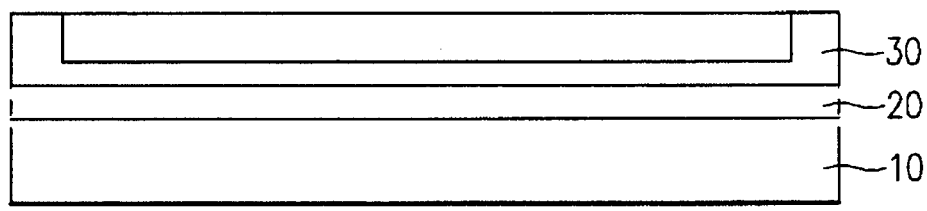
FIGS. 4a to 4g are sectional views illustrating a method of making a signal charge transfer device in accordance with the present invention.
Figure 4B:
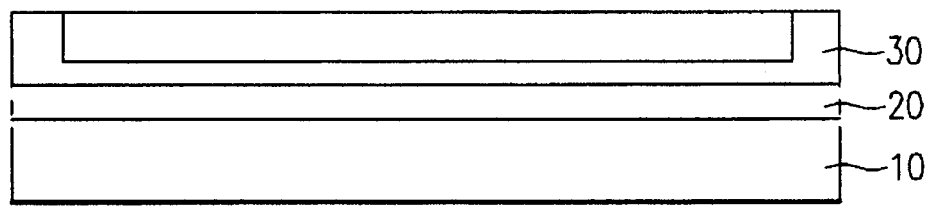

Referring to FIGS. 4a to 4g, there are sectional views illustrating a method of making a signal charge transfer device in accordance with the present invention. In FIG. 4a, a P type well 20 is formed on a n* type semi-conductor substrate 10 by implanting and diffusing P type ions such as boron ions B in the n* type semi-conductor substrate 10, A n° type channel region 30 is then formed partially on the P type well 20 by implanting and diffusing n type ions such as arsenic ions partially in the P type well 20, as shown in FIG. 4b. Herein, a single crystalline silicon may typically be used as a material of the n* type semi-conductor substrate 10.

Figure 4C:
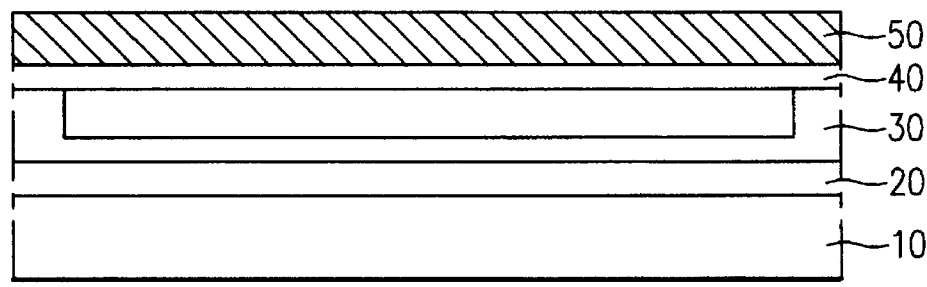

An oxide film 40 as a first insulating layer and a first polysilicon layer 50 are sequentially formed on the n* type channel region 30 and the partially-exposed portions of the P type well 20, as shown in FIG. 4c.

Figure 4D:
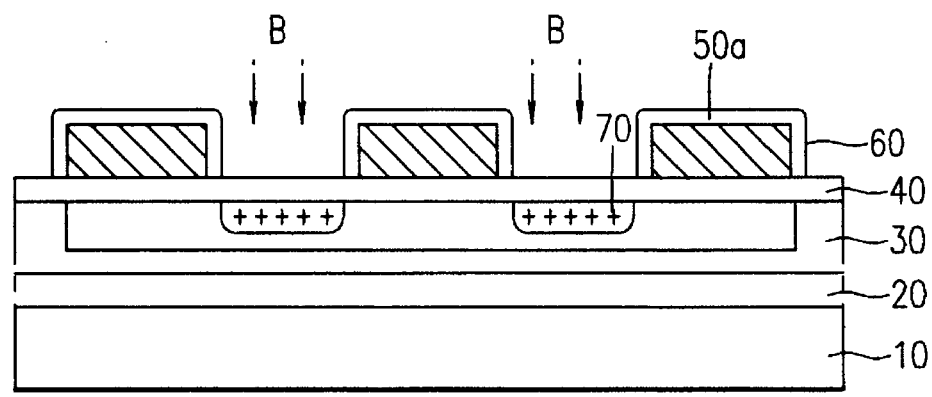

In FIG. 4d, the first polysilicon layer 50 is patterned by photoing and etching processes, so as to form uniformly spaced first polysilicon patterns 50a as first electrodes. Oxide films 60 as second insulating layers are then formed on the surfaces of the first polysilicon patterns 50a. Using the first polysilicon patterns 50a as a mask, the P type impurity ions such as the boron ions B are implanted in the n* type channel region 30 vertically thereto, so as to form in the n° type channel region 30 n– type impurity regions 70 of a concentration lower than that of the n* type channel region 30.

Figure 4E:
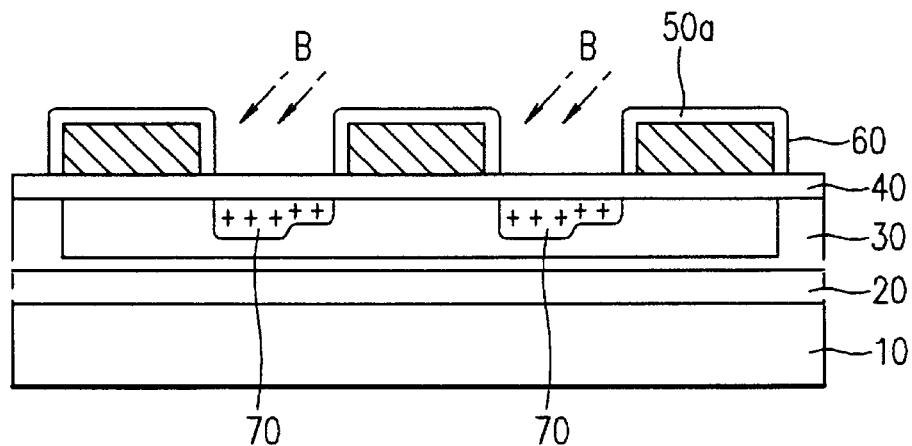

Under the condition of using the first polysilicon patterns 50a as a mask, the P type impurity ions such as the boron ions B are implanted in the n* type channel region 30 slantly at angles of 30°–60° thereto, so as to deform the n– type impurity regions 70 into stepped n– type impurity regions 70a, as shown in FIG. 4e.

Namely, when the boron ions B are implanted slantly in the n* type channel region 30 under the condition of using the first polysilicon patterns 50a as a mask, the boron ions B are again implanted in only certain portions of the n– type impurity regions 70. As a result, the implanted portions of the n– type impurity regions 70 become deeper than other portions thereof, thereby causing the n– type impurity regions 70 to be deformed into the two-stepped n– type impurity regions 70a. As seen from the previous equation (1), n– is of a concentration lower than that of n*.

In the case where the P type boron ions B are repeatedly implanted in the n* type channel region 30, with the implantation angle being lowered gradually, the implanted portions of the n* type channel region 30 are deformed into n– type portions of lower concentration. As a result, there can be made multi-stepped n– type impurity regions.

Figure 4F:
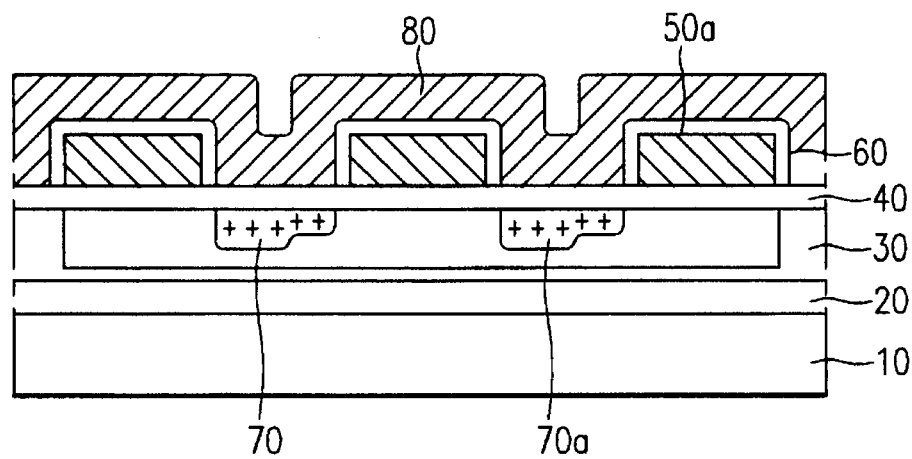

Then as shown in FIG. 4f, a second polysilicon layer 80 is formed on the resultant entire exposed surface or the first polysilicon patterns 50a and the n– type impurity regions 70a.

Figure 4G:
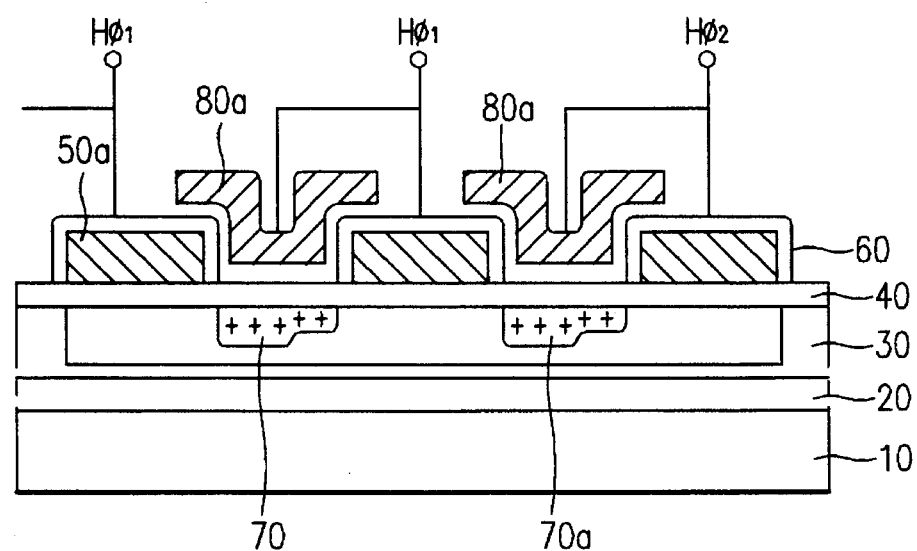

The second polysilicon layer 80 is then patterned to form a plurality of second polysilicon patterns 80a as second electrodes, each being disposed between the adjacent ones of the first polysilicon patterns 50a, as shown in FIG. 4g.

The oxide films 40 and 60 act to electrically isolate the first polysilicon patterns 50a as the first electrodes and the second polysilicon patterns 80a as the second electrodes from each other.

The formation of the oxide films 40 and 60, the first polysilicon layer 50 and the second polysilicon layer 80 is performed using a chemical vapor deposition technique.

Two clock signals or first and second clock signals Hφ1 and Hφ2 are used for two phase clocking for the transfer of signal charges.

It is noted herein that the first and second polysilicon patterns 50a and 80a as the first and second electrodes have the same length 1. Also, the first and second polysilicon patterns 50a and 80a, each is doped with an impurity of a predetermined conductive type, to have a conductivity.

Figure 5A:
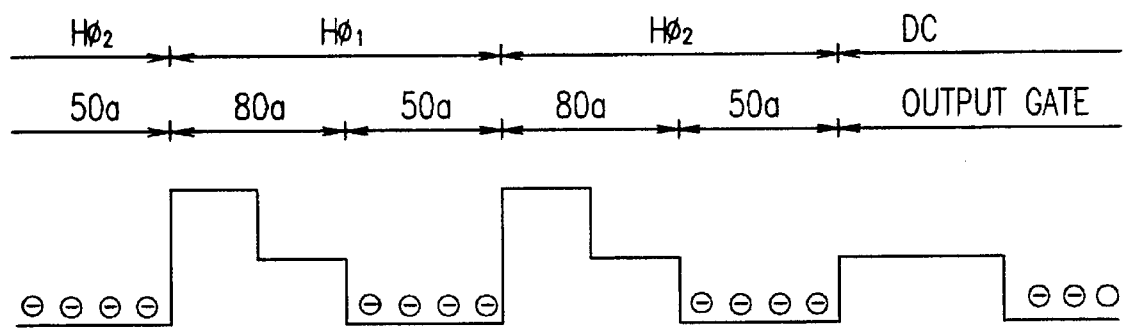
FIGS. 5a to 5c are potential diagrams of the signal charge transfer device of the present invention, which are different according to states of clock signals being applied thereto.
Figure 5B:
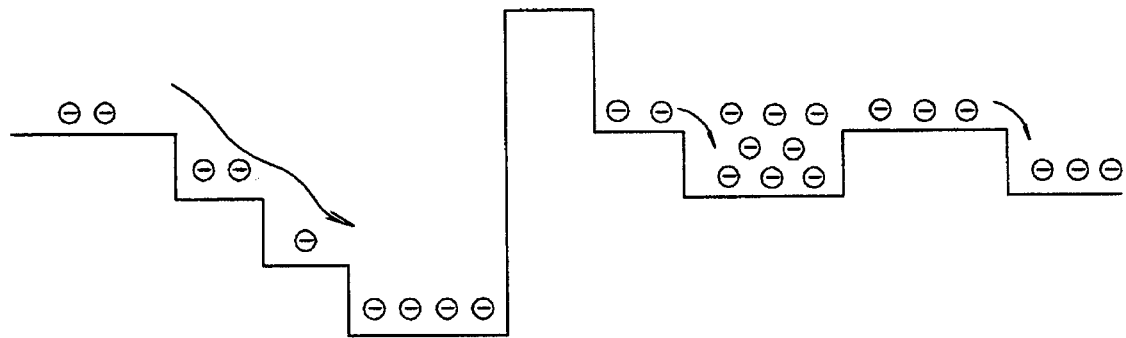
Figure 5C:
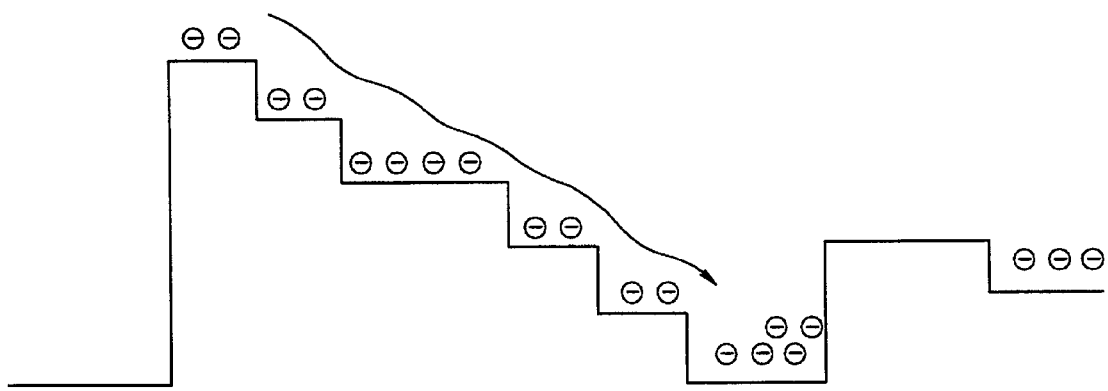

Referring to FIG. 5a to 5c, there are shown potential diagrams of the signal charge transfer device in FIG. 4, which are different according to states of the clock signals being applied thereto.

Figure 1:
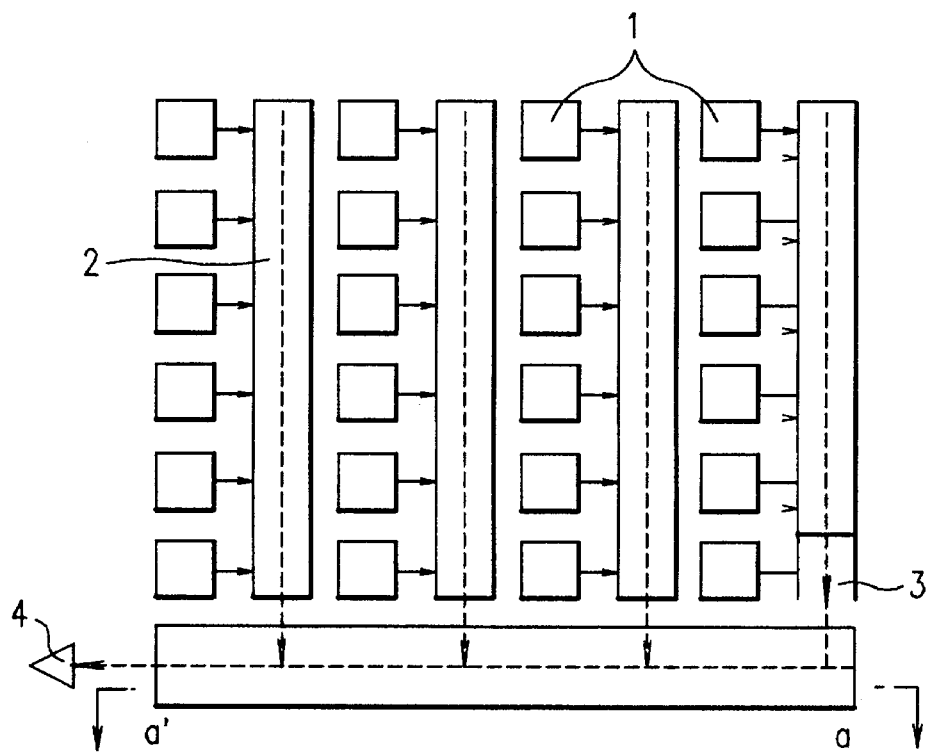
FIG. 1 is a schematic block diagram of a conventional CCD image sensor.
Figure 2:
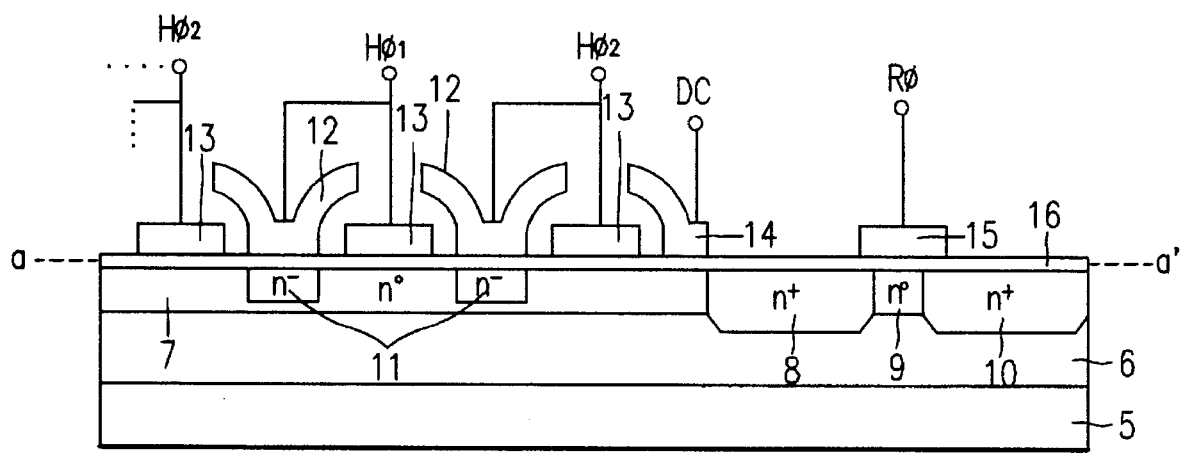
FIG. 2 is a sectional view of a horizontal signal charge transfer device in the conventional CCD image sensor in FIG., 1, taken on the line a—a' of FIG. 1.
Figure 3A:
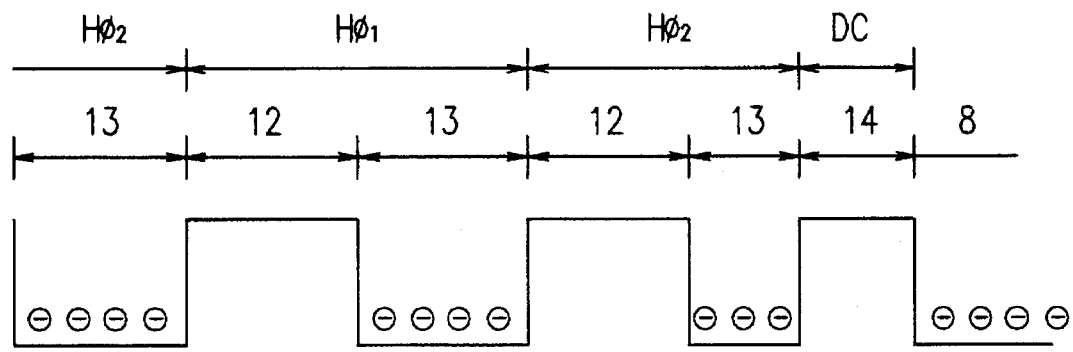
FIGS. 3a to 3c are potential diagrams of the horizontal signal charge transfer device in FIG. 2 which are different according to states of clock signals being applied thereto.

It can be seen from FIG. 5a that more steps are included in the potential diagram as compared with the prior art in FIG. 3a. FIG. 5a is the potential diagram of the signal charge transfer device under the condition of no application of the first and second clock signal s Hφ1 and Hφ2. Upon application of the first clock signal Hφ1 of high level voltage and the second clock signal Hφ2 of low level voltage to the first and second polysilicon patterns 50a and 80a as the first and second electrodes under that condition as shown in FIG. 5a, the potential diagram of the signal charge transfer device is as shown in FIG. 5b.

Also upon application of the first clock signal Hφ1 of low level voltage and the second clock signal Hφ2 of high level voltage to the first and second polysilicon patterns 50a and 80a, the potential diagram of the signal charge transfer device is as shown in FIG. 5c.

Under the condition that the first and second clock signals Hφ1 and Hφ2 are applied to the first and second polysilicon patterns 50a and 80a, with the high and low states being repeated, the potential diagrams in FIGS. 5b and 5c are in turn obtained and the image signal charges are transferred toward the output (the right side in FIG. 4g) of the signal charge transfer device.

Figure 3B:
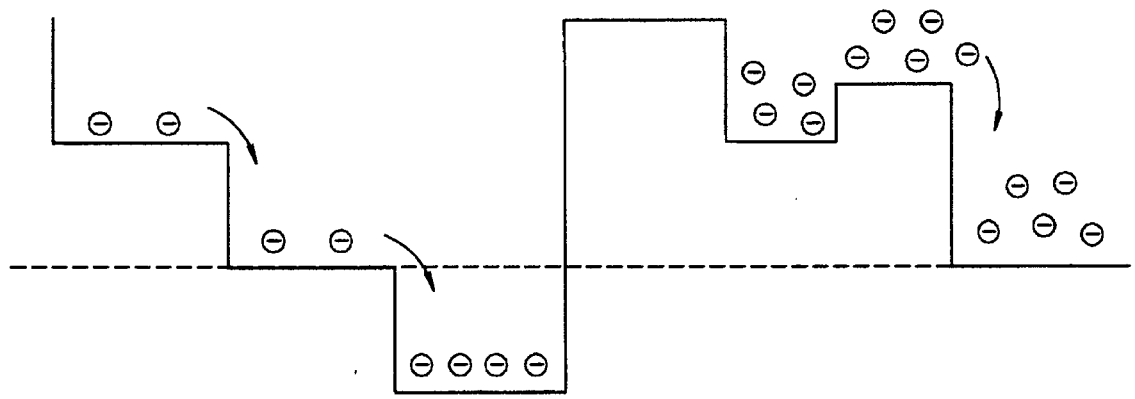
Figure 3C:
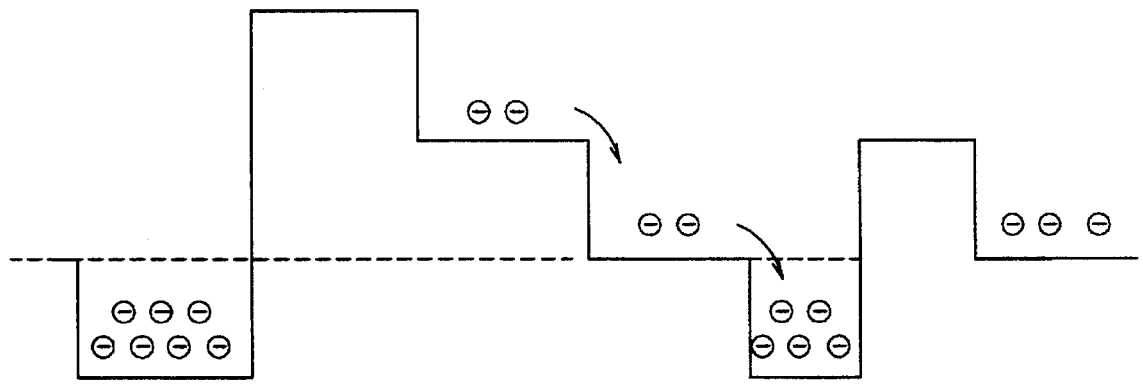

It can be seen from FIGS. 5a to 5c that more steps are included in the potential diagrams as compared with the prior art in FIGS. 3a to 3c. Therefore, in accordance with the present invention, the image signal charges can be transferred more readily toward the output of the signal charge transfer device.

As hereinbefore described, according to the present invention, although the length L of the horizontal unit cell in the signal charge transfer device is the same as that of the prior art, the potentials of more steps can be formed in the signal charge transfer device as compared with the prior art. This results in more ready transfer of the image signal charges and higher CTE in the signal charge transfer device. The CTE obtained according to the present invention corresponds to the case where the length 1 of the electrode is L/6. Therefore, according to the present invention, there can be provided the signal charge transfer device having the higher CTE as compared with the conventional signal charge transfer device having the CTE corresponding to the case where the length 1 of the electrode is L/4.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a signal charge transfer device on a substrate of a first conductivity type, comprising the steps of:

forming a well of a second conductivity type opposite to the first conductivity type on the substrate;

forming a channel region of the first conductivity type in the well;

forming a first insulating layer on the well;

forming a plurality of first electrodes on the first insulating layer;

forming a second insulating layer on each of the plurality of first electrodes;

forming a plurality of stepped impurity regions of the first conductivity type in the channel region, each of the plurality of stepped impurity regions being disposed between adjacent ones of the plurality of first electrodes and the each of the plurality of stepped impurity regions having an impurity concentration lower than an impurity concentration of the channel region; and forming a plurality of second electrodes on the first insulating layer, each of the plurality of second electrodes being disposed between adjacent ones of the first electrodes above a respective one of the plurality of stepped impurity regions.

2. The method of claim 1, wherein the step of forming the plurality of stepped impurity regions includes the steps of:

vertically implanting impurity ions of the second conductivity type into the channel region using the plurality of first electrodes as a first mask; and slantly implanting the impurity ions of the second conductivity type into the channel region using the first electrodes as second mask.

3. The method of claim 1, wherein the first conductivity type is n–type and the second conductivity type is p- type.

4. The method of claim 3, wherein the impurity ions are boron ions.

5. The method of claim 2, wherein the impurity ions are slantly implanted at an angle of 30°–60° with respect to a surface of the substrate.

6. The method of claim 2, wherein the step of slantly implanting the impurity ions is carried out repeatedly and wherein an angle of implantation with respect to a surface of the substrate is decreased.

7. The method of claim 1, wherein the each of the plurality of stepped impurity regions is a two-stepped impurity region.

8. The method of claim 1, wherein the each of the plurality of stepped impurity regions is multi-stepped impurity region.

9. The method of claim wherein the first and second insulating films electrically isolate the plurality of first and second electrodes from each other.

10. The method of claim 1, wherein the plurality of first and second electrodes are formed using a chemical vapor deposition technique.

* * * * *

UNITED STATES PATENT AND TRADEMARK OFFICE
CERTIFICATE OF CORRECTION

PATENT NO. : 5,578,511
DATED : November 26, 1996
INVENTOR(S) : Dong K. SON

It is certified that error appears in the above-indentified patent and that said Letters Patent is hereby corrected as shown below:

Column 7, line 22, delete "the" (first occurrence).

Column 8, line 24, "claim" should read --claim 1--.

Signed and Sealed this

Eleventh Day of November, 1997

Attest:

BRUCE LEHMAN

Attesting Officer

Commissioner of Patents and Trademarks